Figure 1:
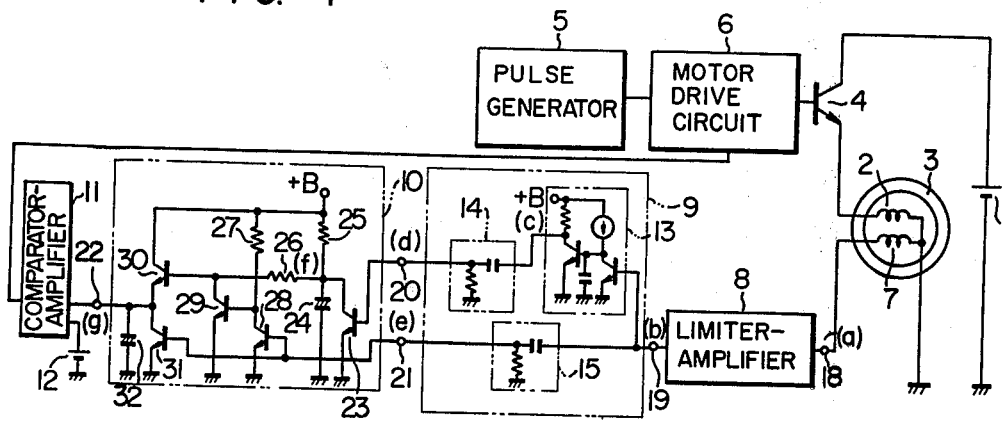

United States Patent [19]

Nakagaki et al.

[11] 4,214,299

[45] Jul. 22, 1980

[54] FREQUENCY-VOLTAGE CONVERTER

[75] Inventors: Harushige Nakagaki; Syunji Iwasaki, both of Toyokawa; Isao Fukushima, Katsuta, all of Japan

[73] Assignee: Hitachi, Ltd., Tokyo, Japan

[21] Appl. No.: 940,007

[22] Filed: Sep. 6, 1978

[30] Foreign Application Priority Data

Sep. 9, 1977 [JP] Japan .................................. 52-107797

[51] Int. Cl.$^2$ ............................................. H02M 7/00
[52] U.S. Cl. .................................. 363/8; 307/233 R; 307/253; 328/141
[58] Field of Search ...................... 307/233, 253, 261; 328/140, 141, 151; 363/8

[56] References Cited

U.S. PATENT DOCUMENTS

| 3,575,611 | 4/1971 | Reed | 328/140 X |
|---|---|---|---|
| 3,601,707 | 8/1971 | Bauer | 328/141 |
| 3,609,395 | 9/1971 | Jania | 307/261 X |
| 3,717,818 | 2/1973 | Herbst | 307/353 X |
| 3,723,891 | 3/1973 | Whiteley | 328/151 X |

Primary Examiner—William M. Shoop
Attorney, Agent, or Firm—Craig & Antonelli

[57] ABSTRACT

A first pulse train has repetition pulses in proportion to the frequency of an input signal. A second pulse train has repetition pulses obtained by shifting the timing phase of the pulses of the first pulse train. One of the pulse trains is used to drive a saw-tooth wave generator circuit, thereby producing a saw-tooth wave voltage, which is supplied to a sample-and-hold circuit, which in turn is driven by the other pulse train so that the saw-tooth wave voltage is sampled and held, thereby producing a DC voltage.

5 Claims, 2 Drawing Figures

FREQUENCY-VOLTAGE CONVERTER

The present invention relates to a frequency-voltage converter suitable for a DC motor speed control servo system used with audio devices such as a record player and a tape recorder.

In recent years, a motor for audio equipment which is comparatively low in speed and has low vibration and noise has often been used. A typical example is what is called the direct-drive motor such as disclosed in U.S. Pat. No. 4,093,897, West German patent application No. P2647675.5 and British patent application No. 43765/76.

The use of such a low-speed motor, however, makes it difficult to both maintain a constant rotational speed and to reduce irregular rotations. Generally, therefore, a speed control system with a servo system is required.

In the servo system, the rotational speed of a DC motor is converted into a sine wave signal proportional to the rotational speed, which sine wave signal is supplied to a differentiator circuit and then to a frequency-voltage converter, thereby producing a DC voltage proportional to the rotational speed of the DC motor. The DC voltage is applied to a comparator-amplifier where it is compared with a reference voltage supplied from a reference voltage source. The output of the comparator is applied to a pulse generator operated in response to the rotation of the motor. Either the resulting pulse current is controlled or is supplied to a drive circuit driven by the pulse generator to thereby control the drive voltage. Thereafter the drive voltage is used to switch a switching transistor and is applied to the rotor magnet of the switching motor, thus controlling the rotational speed at a fixed level.

The present invention concerns the frequency-voltage converter. In the conventional frequency-voltage converters of this type, the pulse signal differentiated by the differentiator circuit is applied to a monostable multivibrator to be triggered, and the output signal of the monostable multivibrator is applied through a low-pass filter and converted into a DC voltage. The monostable multivibrator may be replaced by a switching transistor and a capacitor. In such a conventional configuration of the frequency-voltage converter, the low-pass filter is indispensable. In view of the unavoidable large phase delay caused by the low-pass filter, however, a phase-compensating circuit is required in the stage following the low-pass filter in order to assure stable operation of the servo system, resulting in the disadvantage of a complicated construction. Further, if a ripple is contained unerased in the control voltage which is an output of the low-pass filter, the ripple component varies the motor torque, thus causing irregular rotations. The cut-off frequency of the low-pass filter is thus required to be made sufficiently low, with the result that the phase delay is further increased and the transient response characteristics of the servo system are deteriorated, thereby causing even greater rotational irregularities. Therefore in the conventional frequency voltage converter, a compromise between these two contradicting factors is necessary.

An object of the present invention is to provide a novel frequency-voltage converter without any low-pass filter.

Another object of the invention is to provide a frequency-voltage converter superior in the transient response characteristics, in which the ripple component of the control voltage is sufficiently dampened.

In order to achieve the above-mentioned objects, according to the present invention, two kinds of pulse trains are used; a first pulse train having repetition pulses proportional to the frequency of the input signal, and a second pulse train having repetition pulses obtained by shifting the timing phase of the pulses of the former pulse train. The former pulse train is used to drive the saw-tooth wave generator circuit, thus producing a saw-tooth wave voltage which is applied to a sample-and-hold circuit, while the latter pulse train is used to drive the sample-and-hold circuit for sampling and holding the saw-tooth wave voltage, thus producing a DC voltage.

In the frequency-voltage converter according to the present invention, a low-pass filter is not used for producing a DC control voltage from the saw-tooth wave voltage, and therefore neither phase delay nor deterioration of the transient response characteristics occurs. As a result, the ripple can be removed from the control voltage for improved motor characteristics without requiring phase compensation, thus simplifying the construction.

Figure 2:
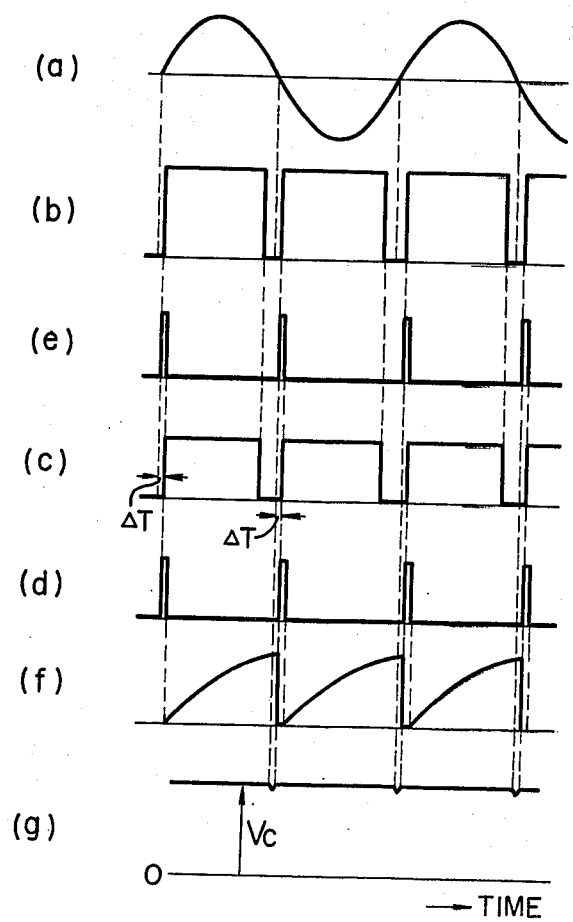

The above and other objects, features and advantages will be made apparent by the detailed description taken in conjunction with the accompanying drawings, in which:

FIG. 1 is a diagram showing a configuration of a servo system for motor speed control including a frequency-voltage converter according to an embodiment of the present invention; and FIG. 2 is a diagram showing waveforms for explaining the operation of the servo system shown in FIG. 1.

In FIG. 1, reference numeral 1 shows a DC power supply, numeral 2 a stator winding of a DC motor, numeral 3 a rotor magnet, numeral 4 a switching transistor, numeral 5 a pulse generator, numeral 6 a motor drive circuit, numeral 7 a rotational speed detection winding, numeral 8 a limiter-amplifier, numeral 9 a differentiator circuit, numeral 10 a frequency-voltage converter, numeral 11 a comparator-amplifier, numeral 12 a reference voltage source, and numerals 18, 19, 20, 21 and 22 terminals.

When a switch of the motor is closed, the pulse generator 5 is actuated, so that predetermined pulses are generated and, the transistor 4 is switched through the drive circuit 6. Therefore an intermittent current flows in the stator winding 2 of the motor from the DC power supply 1, and a torque is generated between the stator winding 2 and the rotor magnet 3, thus rotating the rotor magnet 3.

With the rotation of the rotor magnet 3, an AC voltage is generated across the detection winding 7. This voltage is applied through the terminal 18 to the limiter-amplifier 8, where it is converted into a rectangular wave voltage with a predetermined amplitude. This rectangular wave voltage is applied through the terminal 19 to the differentiator circuit 9 where it is converted into pulses. The differentiator circuit 9 comprises two differentiator circuits 14, 15 and a delay circuit 13. The differentiator circuit 15 is inserted between the terminals 19 and 21, while the delay circuit 13 and the differentiator circuit 14 are connected in series between the terminals 19 and 20. Accordingly, the differentiator circuit 9 is adapted to generate first and second pulse trains at the two terminals 20 and 21.

The frequency-voltage converter 10 according to the present embodiment is driven by these two pulse trains, thus producing a DC voltage at the terminal 22. This output voltage is applied from the terminal 22 to the comparator-amplifier 11 where it is compared with the reference voltage supplied from the reference voltage source 12. The output of the comparator-amplifier 11 is applied to the drive circuit 6, thereby controlling the amplitude of the control pulse applied from the pulse generator 5 to the transistor 4. Thus, the servo system is operated in such a manner that in response to the rotational speed of the motor, the amplitude of the control pulses applied to the transistor 4 changes, thereby maintaining a constant rotational speed of the motor.

The frequency-voltage converter 10 according to the embodiment under consideration includes resistors 25, 26, 27 capacitors 24, 32, and transistors 23, 28, 29, 30, 31. The base of the transistor 23 is connected to the terminal 20, the emitter thereof is grounded, and the collector thereof is connected through the resistor 25 to a power supply +B. The capacitor 24 is inserted between the collector and emitter of the transistor 23. The collector of the transistor 23 is also connected through the resistor 26 to the base of the transistor 30, the collector of the transistor 30 is connected to the power supply +B, and the emitter of the transistor 30 is connected to the terminal 22 on the one hand and grounded through the capacitor 32 on the other hand. The base of the transistor 30 is connected to the collector of the transistor 29, and the base of the transistor 29 is connected to the collector of the transistor 28 and also to the power supply +B through the resistor 27, and the base of the transistor 28 is connected to the terminal 21, and the emitters of the transistors 28 and 29 are substantially grounded. The emitter of the transistor 30 is connected to the collector of the transistor 31, the base of which is connected to the terminal 21, and the emitter of the transistor 31 is grounded.

The operation of this circuit will be described in detail below with reference to the waveform diagram of FIG. 2.

The voltage produced from the detection winding 7 of the motor takes the form of sine wave as shown in (a) of FIG. 2. This sine wave voltage (a) is applied to the limiter-amplifier 8 where it is converted into a rectangular wave voltage as shown in (b) of FIG. 2. A part of the rectangular wave voltage (b) is differentiated by the differentiator circuit 15, thus supplying a pulse train to the terminal 21 as shown in (e) of FIG. 2. The remaining part of the rectangular wave voltage (b) is applied to the delay circuit 13 where it is transformed into a rectangular wave voltage delayed by $\Delta T$ in pulse rise position as shown in (c) of FIG. 2. Then a pulse train as shown in (d) of FIG. 2 is supplied to the terminal 20 from the differentiator circuit 14. In this way, the differentiator circuit 9 generates the first pulse train (e) and the second pulse train (d) at the terminals 20 and 21 respectively. These first and second pulse trains (e) and (d) are so related to each other that, as evident from FIG. 2, the pulse train (e) preceeds the pulse train (d) by $\Delta T$ and each pulse of the second pulse train (d) is generated immediately following each pulse of the first pulse train (e). The second pulse train (d) is applied to the transistor 23 of the frequency-voltage converter 10, thus turning on the transistor 23 in response to each pulse of the pulse train.

The capacitor 24 is charged from the +B power supply through the charging resistor 25 when the transistor 23 is off. Although the terminal voltage of the capacitor 24 increases substantially linearly, it is discharged sharply and the terminal voltage thereof is reduced to zero when the transistor 23 is turned on. As a result, the saw-tooth wave voltage as shown in (f) of FIG. 2 with the frequency equal to the repetition frequency of the pulse train from the differentiator circuit 9 is generated across the capacitor 24.

Immediately before the saw-tooth wave voltage (f) reaches a maximum in each cycle thereof, each pulse of the first pulse train (e) is applied to the transistor 28, thus turning on the transistor 28 in response to each pulse. At the same time, the transistor 29 thus far in on state is turned off and the transistor 30 is biased to conduct in response to the voltage of the capacitor 24 through the resistor 26. In other words, the very instant each pulse of the first pulse train (e) is applied to the transistor 28, the transistor 30 conducts in response to the voltage stored in the capacitor 24, i.e., a voltage substantially equal to the maximum value of the saw-tooth wave voltage (f), so that the capacitor 32 is instantaneously charged from the +B power supply through the transistor 30. The saw-tooth wave voltage (d) is thus sampled and held in the capacitor 32.

During the period when any pulse of the first pulse train (e) fails to be generated, both the transistors 28 and 30 are turned off, while the transistor 29 is turned on. Because of the reverse resistance between the base and emitter of the transistor 30, however, the voltage across the capacitor 32 is substantially maintained until the next pulse arrives.

At the same time that the pulse of the first pulse train (e) is applied to the transistor 28, it is also applied to the transistor 31, thus turning on the same. The transistor 31 thus turned on acts as a constant-current source in the path of the emitter current of the sampling transistor 30, and promotes and speeds up the sampling operation of the capacitor 32. The transistor 31 is not necessarily required for the operation of the device according to the present invention, although the insertion thereof makes the operation more accurate.

In this way, a substantially constant DC control voltage (g) is produced between the terminals of the capacitor 32, which voltage Vc is substantially proportional to the maximum value of the saw-tooth wave voltage (f). This control voltage (g) is applied to the comparator-amplifier 11, where the control voltage (g) is compared with the voltage from the reference voltage source 12. In accordance with the result of the comparison, the drive circuit 6 is controlled in such a way that when the control voltage (g) is low, the amplitude of the control pulse applied from the pulse generator 5 to the transistor 4 is decreased, while when the control voltage (g) is high, the amplitude of the control pulse applied to the transistor 4 is increased.

The larger the current flowing in the stator winding 2 becomes, the larger the motor torque becomes, and vice versa. Therefore, with the increase in the motor revolutions, the torque is decreased and vice versa, by the servo system, thus maintaining the motor speed constant at a predetermined value.

What is claimed is:

1. A frequency-voltage converter for converting a frequency to a DC voltage by use of a first pulse train having repetition pulses proportional to the frequency of an input signal and a second pulse train having repetition pulses obtained by shifting the pulses of said first pulse train in timing phase, said frequency-voltage converter comprising; a saw-tooth wave voltage generator circuit driven by said second pulse train for generating repetition saw-tooth wave signal, and a sample-and-hold circuit connected to said saw-tooth wave generator circuit and driven by said first pulse train for sampling and holding each pulse of said saw-tooth wave voltage, thereby producing a DC voltage.

2. A frequency-voltage converter according to claim 1, in which said saw-tooth wave generator circuit includes a first switching means turned on in response to each pulse of said second pulse train and turned off between each adjacent pulses of said second pulse train; and a first capacitor connected in parallel with said first switching means for producing at the output thereof a saw-tooth wave voltage which returns to the minimum value when said first switching means is turned on; said sample-and-hold circuit including an active element connected in DC fashion to the output of said first capacitor, a second switching means connected to said active element, said second switching means being turned off and turning on said active element in response to each pulse of said first pulse train, and a second capacitor connected to said active element for sampling and holding each saw-tooth pulse of said saw-tooth wave voltage each time said active element is turned on.

3. A frequency-voltage converter according to claim 2, in which said second switching means includes a first switching element turned on in response to each pulse of said first pulse train and a second switching element connected between said first switching element and said active element, said second switching element being turned off and turning on said active element each time of the turning on of said first switching element.

4. A frequency-voltage converter according to claim 2, in which said active element comprises a transistor with the base thereof connected in DC fashion to said first and second switching means, the emitter of said transistor being connected to said second capacitor.

5. A frequency-voltage converter according to claim 2, in which said sample-and-hold circuit fruther includes a third switching means connected to said active element and turned on in response to each pulse of said second pulse train, said fifth switching element thus acting as a constant-current source in the current path of said active element.

* * * * *